United States Patent
Lawton et al.

(10) Patent No.: US 6,749,976 B2
(45) Date of Patent: *Jun. 15, 2004

(54) SOLID IMAGING COMPOSITIONS FOR PREPARING POLYPROPYLENE-LIKE ARTICLES

(75) Inventors: John A. Lawton, Landenberg, PA (US); Chander P. Chawla, Batavia, IL (US)

(73) Assignee: DSM Desotech, Inc., Elgin, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/035,230

(22) Filed: Jan. 4, 2002

(65) Prior Publication Data

US 2002/0081505 A1 Jun. 27, 2002

Related U.S. Application Data

(63) Continuation of application No. 09/538,940, filed on Mar. 31, 2000, now Pat. No. 6,379,866.

(51) Int. Cl.$^7$ .............................. G03F 7/028; G03C 9/08
(52) U.S. Cl. ...................... 430/15; 430/269; 430/280.1; 204/401
(58) Field of Search ............................... 430/15, 280.1, 430/269; 264/401

(56) References Cited

U.S. PATENT DOCUMENTS

| | | | |
|---|---|---|---|
| 3,803,466 A | 4/1974 | Starkey | |
| 4,844,144 A | 7/1989 | Murphy et al. | 164/35 |
| 5,047,546 A | 9/1991 | Parrinello et al. | |
| 5,136,682 A | 8/1992 | Moyer et al. | |
| 5,155,143 A | 10/1992 | Koleske | |
| 5,176,188 A | 1/1993 | Quinn et al. | 164/516 |
| 5,364,889 A | 11/1994 | Quinn et al. | 522/71 |
| 5,418,112 A | 5/1995 | Mirle et al. | 430/284.1 |
| 5,476,748 A | 12/1995 | Steinmann et al. | 430/280.1 |
| 5,500,040 A | 3/1996 | Fujinami | 106/21 A |
| 5,707,780 A | 1/1998 | Lawton et al. | |
| 5,972,563 A | 10/1999 | Steinmann et al. | 430/280.1 |
| 6,025,114 A | 2/2000 | Popat et al. | 430/284.1 |
| 6,054,250 A | 4/2000 | Sitzmann et al. | |
| 6,096,796 A | 8/2000 | Watanabe et al. | 430/280.1 |
| 6,100,007 A * | 8/2000 | Pang et al. | 430/280.1 |
| 6,127,085 A | 10/2000 | Yamamura et al. | 430/280.1 |
| 6,130,025 A | 10/2000 | Chikaoka et al. | 430/280.1 |
| 6,136,497 A | 10/2000 | Melisaris et al. | 430/280.1 |
| 6,187,836 B1 | 2/2001 | Oxman et al. | |
| 6,287,748 B1 | 9/2001 | Lawton | 430/280.1 |
| 6,379,866 B2 | 4/2002 | Lawton et al. | |
| 6,537,729 B1 | 3/2003 | Lawton | |

FOREIGN PATENT DOCUMENTS

| | | | | |
|---|---|---|---|---|
| CA | 2211628 A1 | * | 1/1998 | ........... G03F/7/038 |
| EP | 837 366 | | 4/1998 | |
| EP | 848 292 | | 6/1998 | |
| EP | 0848293 | | 6/1998 | |
| EP | 822445 A1 | | 12/1998 | |
| EP | 0938026 | | 8/1999 | |
| JP | 02075618 | | 3/1990 | |
| WO | 96/35756 | | 11/1996 | |
| WO | 96/41239 | | 12/1996 | |
| WO | 9738354 | | 10/1997 | |
| WO | 97/42549 | | 11/1997 | |
| WO | 98/36323 | | 8/1998 | |
| WO | 9928295 | | 6/1999 | |
| WO | 00/0330 | | 1/2000 | |

OTHER PUBLICATIONS

BASF Chemical Intermediates: Poly THF; Quality expands–worldwide, online source www.basf.de/en/produkte/chemikalien/interm/pol, 4 pages, copyright 1999,BASF Aktiengesellschaft.

Kirk –Othmer Encyclopedia of Chemical Technology, fourth edition, vol. 19, "Tetrahydrofuran and Oxetane Polymers", John Wiley & Sons, New York, N.Y., pp. 743–746, 758–764, 768–777, Copyright 1996.

Designing with Thermoplastics, 2 pages, from 222.dow.com/engineer... stics/tech/guide, Engineering Plastics, Technical Support, copyright The Dow Chemical Company 1995–2003. Mechanical Properties: Tensile Properties.

Instron from www.instron.com, Plastics—properties, applicaiotns by Material, 3 pages, "Tension Test", Application by test type Tension, 2 pates, "Flexure Test", application by test–Flexure, 2 pages, Glossary of Materials Testing terms (F–K (4 pages), L–O (4 pages) and T (3 pages)), copyright 1997 2003, Instron Corporation, Canton MA, USA.

RN 4687–94–9 from Registry copyright 2003 ACS on STN, American Chemical Society, two pages.

RN 4491–03–6 from Registry copyright 2003 ACT on STN, American Chemical Society, one page.

RN 6440102 from Registry copyright 2003 ACT on STN, American Chemical Society, two pages.

RN 119846–20–7 from Registry copyright 2003 ACT on STN, American Chemical Society, one page.

* cited by examiner

*Primary Examiner*—Cynthia Hamilton
(74) *Attorney, Agent, or Firm*—Pillsbury Winthrop LLP

(57) ABSTRACT

This invention discloses compositions adapted to produce, through solid imaging means, excellent quality objects having material properties that simulate the look and feel of polypropylene articles.

13 Claims, No Drawings

SOLID IMAGING COMPOSITIONS FOR PREPARING POLYPROPYLENE-LIKE ARTICLES

This is a Continuation of U.S. application Ser. No. 09/538,940 (now U.S. Pat. No. 6.379.866) filed Mar. 31, 2000.

FIELD OF THE INVENTION

This invention discloses compositions adapted to produce, through solid imaging means, excellent quality objects having material properties that simulate the look and feel of polypropylene articles.

BACKGROUND OF INVENTION

In the field of liquid-based solid imaging, alternatively known as stereolithography, compositions have been developed which are capable of generating solid objects having the properties of epoxies and/or acrylates. Solid imaging generated objects made from previous epoxy and/or acrylate compositions provide a prototypical representation of the physical shape of plastic articles made on a production basis out of materials such as ABS, nylon, polyethylene, propylene, etc. However, such compositions lack the material properties that give users of the prototypes a sense of look and feel for the object when produced in the production material. Such a lack of look and feel accuracy in product prototyping is not just an aesthetic issue. The look and feel of a prototype also has significant engineering, design, packaging, labeling, and advertising implications.

Other examples may be made regarding the importance of appearance of an article when made out of certain materials. For example, use of a transparent prototype composition or an overly opaque composition may mislead those viewing the article into incorrect assumptions regarding appropriate packaging, labeling, coloring, and advertising of a product.

Other considerations when trying to utilize solid imaging for prototyping include photospeed, resistance to humidity, low potential for hydrolysis, similar coefficient of friction, dimensional accuracy, ability to span without supports during fabrication, and wide process latitude.

Japanese Patent Application Hei 275618 describes epoxy and acrylate compositions for use in optical molding. The compositions contain at least 40 wt % of alicyclic epoxy resin with at least two epoxy groups in each molecule.

SUMMARY OF INVENTION

This invention features photosensitive compositions that, upon exposure to actinic radiation, have one or more of the following polypropylene characteristics, specifically:

(i) an elongation at yield in the range of 7% to no yield;

(ii) a tensile modulus in the range of 1000 to 1600 $N/mm^2$;

(iii) an average elongation at break of at least 10%; or (iv) a yield stress of 28 to 40 $kN/mm^2$.

The invention also relates to a three-dimensional article formed from a photosensitive composition including (a) 30–70% by weight of an epoxide-containing material;

(b) 5–35% by weight of an acrylic material selected from aromatic acrylic material, cycloaliphatic acrylic material, or combinations thereof;

(c) 0–40% by weight of a hydroxyl-containing material;

(d) at least one cationic photoinitiator; and (e) at least one free-radical photoinitiator.

In preferred embodiments, the photosensitive composition includes 35–69.9% by weight of an epoxide-containing material. Preferably, the epoxide-containing material can have a poly(tetramethylene oxide) backbone. The composition can include 10–20% by weight of an acrylic material. The composition can include 10–39% by weight of a hydroxyl-containing material. Preferably, the hydroxyl-containing material can be an aliphatic polycarbonate diol.

DESCRIPTION OF THE PREFERRED EMBODIMENTS

Liquid based solid imaging is a process wherein a photoformable liquid is coated into a thin layer upon a surface and exposed imagewise to actinic radiation such that the liquid solidifies imagewise. Subsequently, new thin layers of photoformable liquids are coated onto previous layers of liquid or previously solidified sections. Then the new layer is exposed imagewise in order to solidify portions imagewise and in order to induce adhesion between portions of the new hardened region and portions of the previously hardened region. Each imagewise exposure is of a shape that relates to a pertinent crosssection of a photohardened object such that when all the layers have been coated and all the exposures have been completed, an integral photohardened object can be removed from the surrounding liquid composition.

One of the most important advantages of the solid imaging process is the ability to rapidly produce actual objects that have been designed by computer aided design. A significant amount of progress has been made with compositions and processes that have been adapted to improve the accuracy of the objects produced. Also, composition developers have made significant progress toward improving individual properties such as the modulus or deflection temperature of the photohardened objects. However, attempts to simulate a particular set of physical properties of a common manufacturing material to such a degree that the material made could be easily mistaken for the material simulated, based upon look and feel properties, have been unsuccessful.

During the development of the compositions disclosed herein, it was noted that substantial changes in the look and feel of articles fabricated by the liquid solid imaging process could be attained by slight alterations in component concentration. Surprisingly it was found that by making these alterations in composition, articles could be made that had the look and feel of articles manufactured from polypropylene materials. Within the field of liquid solid imaging such a discovery is a first in that previous commercial compositions did not make articles that elicited a similar look and feel sense with regard to any other common plastic. It was then recognized that by tailoring the composition, the properties of polypropylene manufactured articles could be simulated. This potential therefore solved an oft expressed but unfilled need to produce prototypes that not only had the appearance of desired objects but also material properties that simulated the look and feel of the materials out of which production objects were destined to be manufactured.

In order to simulate a material in terms of look and feel, it is necessary to decide upon the appropriate appearance factors and physical properties. For example, in the field of liquid solid imaging the most commonly quoted fully cured part physical properties are the tensile stress, tensile modulus, elongation at break, average elongation at yield, flexural stress, flexural modulus, impact strength, hardness and deflection temperature. Some of these physical properties, such as, for example, elongation at break, are not something that can be "felt" unless the material is deformed. Such physical properties are therefore not indicative of a good simulation material property.

In some cases, the characteristics of a material that serve to define the look and feel properties of a particular material are difficult to define. This is especially so in the case of how a materials looks. However, in the case of the instant invention a deliberate compositional choice was made such that articles fabricated through solid imaging means, when given various amounts of exposure to actinic radiation, had a similar color and light scattering characteristic as various grades of polypropylene. It was also found that changing the actinic exposure can also modify the feel properties of the articles manufactured from the composition by the solid imaging process.

Tensile properties are best representative of how the articles feel. The "elongation at yield" is the percent elongation at the yield point. For the purposes of this invention, the yield point in a tensile stress-strain test is where a large increment of strain occurs at constant stress. Some samples may break prior to the yield point or at the yield point. All tensile properties as discussed herein were measured according to ASTM Test D638M, without humidity control.

By far, the most important property that relates to what is felt when handling a material, is the tensile modulus. This is representative of the feeling of stiffness.

A second important property is that of the elongation of the material. When a simulation of a material is handled and flexed, it should not break or permanently distort if the material being simulated does not break or distort with such handling. With plastics there is considerable debate relating to the point at which a sample under stress transitions from an elastic mode to a plastic mode of behavior. However, most would agree that when a material begins to yield, its behavior is plastic and that any handling that brings a sample past its yield point will leave the sample permanently distorted. For the purposes of this invention the tensile elongation at yield serves to help define this aspect of the feel of a material.

A third important physical property is the tensile stress. For the purposes of this invention, a tensile stress for a material that breaks at or before its yield is an important property for simulation purposes. Simulation materials that have a yield stress or break stress (before yield) that is lower than the lowest yield stress or break stress (before yield) of a simulated material are less preferable simulation materials.

Another important physical property is that of the sense of feel for inherent toughness. The Izod impact strength provides a good measure of the toughness of a material. A good simulation material will have toughness in a range that is close to that of the simulated material. For the discussion herein, the impact strength is measured by the notched Izod test, according to ASTM Test D256A.

In general, useful articles are not really used to the point of breaking. For example, if a squeeze bottle is made of a material that breaks during normal use it will have little value. And in general, useful articles are not often used such that they are stressed past their yield capabilities. For example, if bridges were designed to withstand normal loads, such as a car, which induced stresses in support members exceeding the yield point, the bridge would increase in sag for every car that passed over it. Exceptions may be found for some applications such as, for example, living hinges. In these cases, often the first use of the article induces a stress that exceeds the yield of the material, but subsequent stresses remain for the most part within the elastic range of the material. For the purposes of the instant invention, material property values relating to the break of a material, for a material having a yield point, are of little interest in terms of simulating the look and feel of a simulated material.

The tensile stress usually quoted is the maximum tensile stress, which is either the stress at yield or the stress at break. If the material breaks before it yields, the tensile stress at break of the simulation material should be compared to the tensile yield stress of the simulated material. If the simulation material exhibits a yield point, the tensile yield stress of the simulation material should be compared to the tensile yield stress of the simulated material. In the case of polypropylene, the tensile stress at yield is 31 to 37.3 kN/mm$^2$. Simulation compositions can have a yield stress of 28 to 40 kN/mm$^2$, preferably 31 to 38 kN/mm$^2$.

The tensile modulus (and/or the flexural modulus) is probably the most important physical property with respect to the feel of a material. People can generally feel the stiffness of a material and can tell if the material is not stiff enough or if the material is too stiff. This is because the modulus is a material property that is determined in the working range of a material (i.e. prior to plastic deformation of the material) and is a material property that can be felt or measured at relatively low stress levels. In general, a suitable simulation material has a tensile modulus which is within the range of moduli of the simulated material. Polypropylene has a tensile modulus range of from approximately 1135 to 1550 N/mm$^2$. It has been found that simulation compositions resulting in parts having a tensile modulus in the range of 1000 to 1600 N/mm$^2$ are suitable simulation materials. Parts having a modulus below that range are generally too soft and pliable to have any utility as a polypropylene simulation. Conversely, parts having a modulus above that range are too stiff. Preferably, the compositions result in parts having a tensile modulus in the range of 1100 to 1575 N/mm$^2$.

In the case of the most preferred simulation material for polypropylene, it has been discovered that variations in the exposure during the solid imaging process lead to significant variations in the tensile modulus. This is extremely advantageous for a simulation material since the modulus can be varied over a range that very closely matches the modulus range of the simulated material. Such a simulation material is therefore adaptable to simulate various molecular weights and grades of polypropylene, for example.

The elongation properties of a simulation material are also important. If the simulation material has a tensile elongation at break that is lower than the minimum tensile elongation at yield of the simulated material, it is regarded as not suitable. If the material has a yield point, the tensile elongation at yield of the simulation material is compared with the tensile elongation at yield of the simulated material. If the material does not have a yield point, the tensile elongation at break of the simulation material is compared with the tensile elongation at yield of the simulated material. Polypropylene has a tensile elongation at yield range of 7–13%. Therefore a suitable simulation material for polypropylene will have a tensile elongation at break (before yield) or a tensile elongation at yield of 7% or greater to no yield.

The impact resistance of a simulation material relative to the impact resistance of a simulated material is also of some importance. For example, it is not unusual for someone handling an object to knock the object against the corner of a table. From such treatment a feel of the materials toughness and sound qualities (deadening, ringing, etc.) can be garnered. For the purposes of this patent, a suitable simulation material will have an Izod impact strength that is nearly as strong as the Izod impact strength of the simulated material. Polypropylene has a notched Izod Impact Strength of 21.4 to 74.9 J/m (ASTM D256A). Therefore a suitable simulation material for polypropylene has a notched Izod Impact Strength of at least 21 J/m.

The appearance of a simulation material is also an important consideration. Polypropylene has a cloudy appearance. Therefore a suitable simulation material for polypropylene should also have a cloudy appearance and, as much as possible for UV cured materials, minimum color.

The compositions of the invention generally comprise an epoxide-containing material, a free-radical polymerizable acrylic material, a hydroxyl-containing material, a cationic photoinitiator and a free-radical photoinitiator.

The epoxide-containing materials that are used in the compositions, according to this invention, are compounds that possess on average at least one 1,2-epoxide group in the molecule. By "epoxide" is meant the three-membered ring

The epoxide-containing materials, also referred to as epoxy materials, are cationically curable, by which is meant that polymerization and/or crosslinking and other reaction of the epoxy group is initiated by cations. The materials can be monomers, oligomers or polymers and are sometimes referred to as "resins." Such materials may have an aliphatic, aromatic, cycloaliphatic, arylaliphatic or heterocyclic structure; they comprise epoxide groups as side groups, or those groups form part of an alicyclic or heterocyclic ring system. Epoxy resins of those types are generally known and are commercially available.

The epoxide-containing material (a) should comprise at least one liquid component such that the combination of materials is a liquid. Thus, the epoxide-containing material can be a single liquid epoxy material, a combination of liquid epoxy materials, or a combination of liquid epoxy material(s) and solid epoxy material(s) which is soluble in the liquid.

Examples of suitable epoxy materials include polyglycidyl and poly(methylglycidyl) esters of polycarboxylic acids, or poly(oxiranyl) ethers of polyethers. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. The polyether can be poly(tetramethylene oxide). It is likewise possible to use carboxyterminated adducts, for example, of trimellitic acid and polyols, such as, for example, glycerol or 2,2-bis(4-hydroxycyclohexyl) propane.

Suitable epoxy materials also include polyglycidyl or poly(-methylglycidyl) ethers obtainable by the reaction of a compound having at least one free alcoholic hydroxy groups and/or phenolic hydroxy groups and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl) propane, or 1,1-bis(hydroxymethyl)cyclohex-3-ene; or contain aromatic nuclei, such as N,N-bis(2-hydroxyethyl) aniline or p,p'-bis(2-hydroxyethylamino)diphenylmethane.

The epoxy compounds may also be derived from mono nuclear phenols, such as, for example, from resorcinol or hydroquinone, or they may be based on polynuclear phenols, such as, for example, bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs.

Suitable epoxy materials also include poly(N-glycidyl) compounds are, for example, obtainable by dehydrochlorination of the reaction products of epichlorohydrin with amines that comprise at least two amine hydrogen atoms, such as, for example, n-butylamine, aniline, toluidine, m-xylylene diamine, bis(4-aminophenyl)methane or bis(4-methylaminophenyl)methane. The poly(N-glycidyl) compounds also include, however, N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Examples of suitable epoxy materials include poly(S-glycidyl) compounds which are di-S-glycidyl derivatives which are derived from dithiols, such as, for example, ethane-1,2-dithiol or bis(4-mercaptomethylphenyl) ether.

Preferably epoxide-containing materials are selected from the group consisting of bis(2,3-epoxycyclopentyl)ether, 2,3-epoxy cyclopentyl glycidyl ether, 1,2-bis(2,3-epoxycyclopentyloxy)ethane, bis(4-hydroxycyclohexyl) methane diglycidyl ether, 2,2-bis(4-hydroxycyclohexyl) propane diglycidyl ether, 3,4-epoxycyclohexylmethyl-3,4-epoxycyclohexane, 3,4-epoxy-6-methylcyclohexylmethyl-3,4-epoxy-6-methylcyclohexanecaboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, vinylcyclohexene dioxide, dicyclopentadiene diepoxide, α-(oxiranylmethyl)-ω-(oxiranylmethoxy) poly(oxy-1,4-butanediyl), diglycidyl ether of neopentyl glycol, or 2-(3,4-epoxycyclohexyl-5,5-spiro-3,4-epoxy)cyclohexane-1,3-dioxane, and combinations thereof.

It is, however, also possible to use epoxy resins in which the 1,2-epoxy groups are bonded to different heteroatoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1,3-bis(5,5-dimethyl-1-glycidylhydantoin-3-yl)propane.

In addition, liquid prereacted adducts of such epoxy resins with hardeners are suitable for epoxy resins.

It is of course also possible to use mixtures of epoxy materials in the compositions according to the invention.

Preferred epoxy materials are cycloaliphatic diepoxides. Especially preferred are bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl) ether, 2-(3,4-epoxycyclohexyl-5,5-spiro-3,4-epoxy)cyclohexane-1,3-dioxane, and combinations thereof.

The epoxy materials can have molecular weights which vary over a wide range. In general, the epoxy equivalent weight, i.e., the number average molecular weight divided by the number of reactive epoxy groups, is preferably in the range of 60 to 1000.

Preferably the composition of the invention comprises from 30 to 70% by weight of the epoxide containing material.

The free-radical polymerizable acrylic materials that are used in the composition, according to this invention, are compounds that have, on average, at least one acrylic group which can be either the free acid or an ester. By "acrylic" is meant the group —CH=CR$^1$CO$_2$R$^2$, where R$^1$ can be hydrogen or methyl and R$_2$ can be hydrogen or alkyl. By "(meth)acrylate" is meant an acrylate, methacrylate or combinations thereof. The acrylic materials undergo polymerization and/or crosslinking reactions initiated by free radicals. The acrylic materials can be monomers, oligomers or polymers. It is preferred that the acrylic material be a monomer or oligomer.

Suitable as the acrylic component are, for example, the diacrylates of cycloaliphatic or aromatic diols, such as 1,4-dihydroxymethylcyclohexane, 2,2-bis(4-hydroxycyclohexyl)propane, 1,4-cyclohexanedimethanol, bis(4-hydroxycyclohexyl)methane, hydroquinone, 4,4-dihydroxybiphenyl, bisphenol A, bisphenol F, bisphenol S, ethoxylated or propoxylated bisphenol A, ethoxylated or propoxylated bisphenol F, or ethoxylated or propoxylated bisphenol S, and combinations thereof. Such acrylates are known and some of them are commercially available.

Preferred are compositions comprising as the acrylic component a compound of formula I, II, III or IV

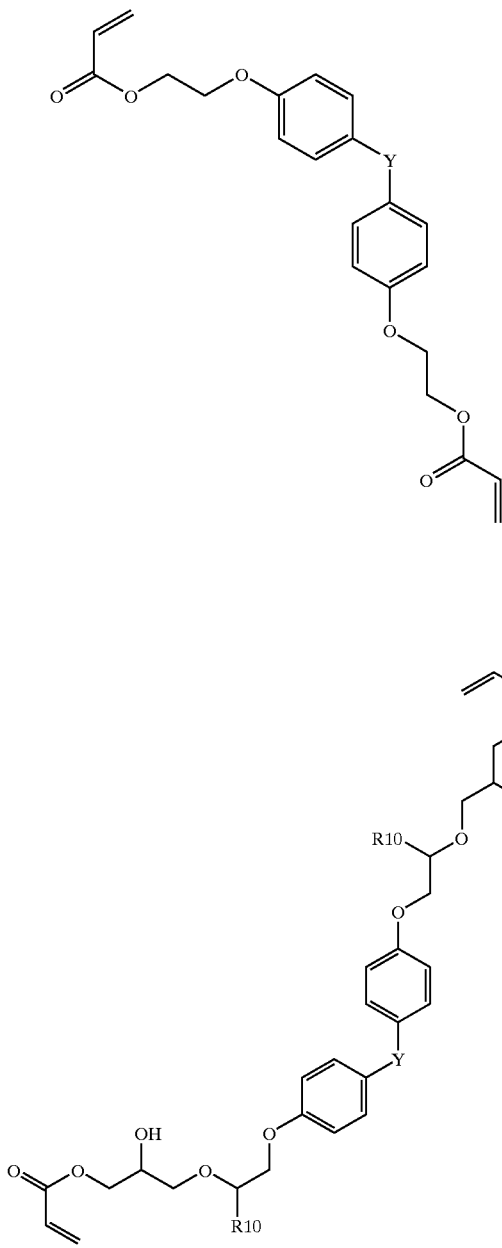

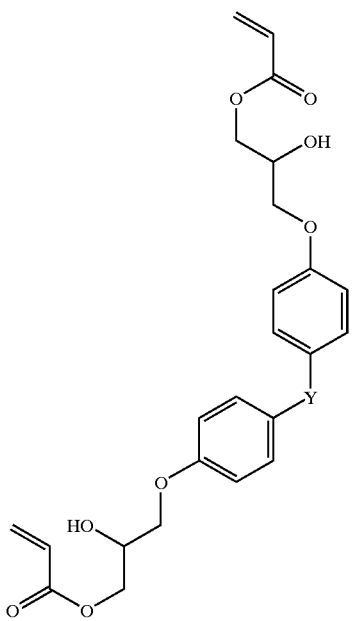

wherein:
Y is a direct bond, C1–C6 alkylene, S, O, SO, SO$_2$, or CO,
R10 is a C1–C8 alkyl group, a phenyl group that is unsubstituted or substituted by one or more C1–C4 alkyl groups, hydroxy groups or halogen atoms, or a radical of the formula CH$_2$R11, wherein R11 is a C1–C8 alkyl group or a phenyl group, and A is a radical of the formula

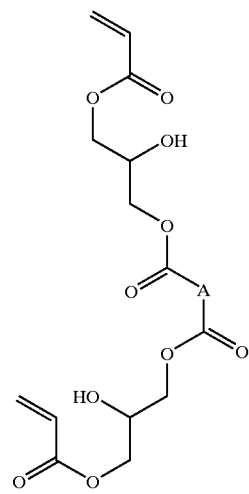

or comprising as the acrylic component a compound of any one of formulae Va to Vd, (Va)

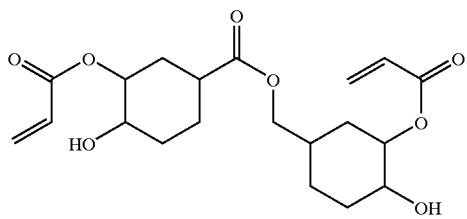

(Vb)

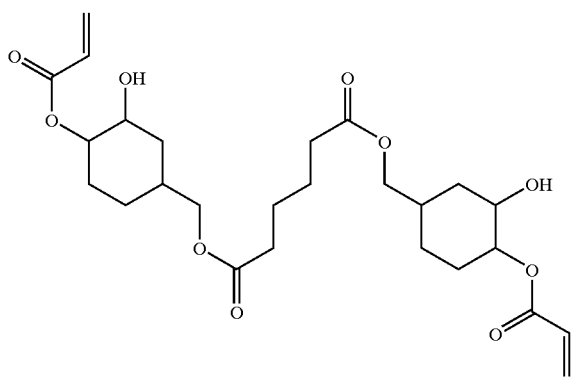

and the corresponding isomers, (Vc)

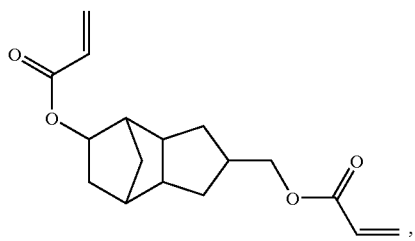

or (Vd)

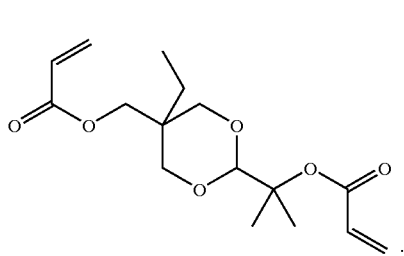

If a substituent is C1–C4 alkyl or C1–C8 alkyl, it may be straight-chained or branched. A C1–C4 alkyl may be, for example, methyl, ethyl, n-propyl, isopropyl, n-butyl, sec-butyl, iso-butyl or tert-butyl, and a C1–C8 alkyl may additionally be, for example, the various pentyl, hexyl, heptyl, or octyl isomers.

If a substituent is halogen, it is fluorine, chlorine, bromine, or iodine, but especially chlorine or bromine.

If a substituent is C1–C6 alkylene it is, for example, methylene, ethylene, propylene (methylethylene), trimethylene, 1,1-propanediyl, 2,2-propanediyl, tetramethylene, ethylmethylene, 1,1-butanediyl, 2,2-butanediyl, pentamethylene or hexamethylene. The alkylene radicals may also be substituted by halogen atoms. Examples of halogenated alkylene radicals are $C(CCl_3)_2$ and $C(CF_3)_2$.

Especially preferred in the compositions are compounds of the formula I, II or III wherein Y is —$CH_2$— or —$C(CH_3)_2$—. Also especially preferred are compounds of formulas II and III wherein R10 is n-butyl, phenyl, n-butoxymethyl, or phenoxymethyl.

Suitable as aromatic tri(meth)acrylates are, for example, the reaction products of triglycidyl ethers of trihydric phenols, and phenol or cresol novolacs having three hydroxy groups with (meth)acrylic acid. Preferably the acrylic material is selected from 1,4-dihydroxymethyl-cyclohexane diacrylate, bisphenol A diacrylate, ethoxylated bisphenol A diacrylate and combinations thereof.

Compositions wherein the acrylic component is an acrylate of bisphenol A diepoxide such as Ebecryl 3700® from UCB Chemical Corporation, Smyrna, Ga. or an acrylate of 1,4-cyclohexanedimethanol are especially preferred for compositions used in this invention.

In addition to the aromatic or cycloaliphatic acrylic material, other acrylic materials can be present. Liquid poly(meth)acrylates having functionality of greater than 2 may, where appropriate, be used in the compositions according to the invention. These can be, for example, tri, tetra, or pentafunctional monomeric or oligomeric aliphatic (meth) acrylates.

Suitable as aliphatic polyfunctional (meth)acrylates are, for example, the triacrylates and trimethacrylates of hexane-2,4,6-triol, glycerol, or 1,1,1-trimethylolpropane, ethoxylated or propoxylated glycerol, or 1,1,1-trimethylolpropane and the hydroxy group-containing tri(meth)acrylates which are obtained by the reaction of triepoxy compounds, such as, for example, the triglycidyl ethers of the mentioned triols, with (meth)acrylic acid. It is also possible to use, for example, pentaerythritol tetra-acrylate, bistrimethylolpropane tetra-acrylate, pentaerythritol monohydroxytri(meth) acrylate, or dipentaerythritol monohydroxypenta(meth) acrylate, and combinations thereof.

It is also possible to use hexafunctional urethane (meth) acrylates. Those urethane (meth)acrylates are known to the person skilled in the art and can be prepared in known manner, for example by reacting a hydroxy-terminated polyurethane with acrylic acid or methacrylic acid, or by reacting an isocyanate-terminated prepolymer with hydroxyalkyl (meth)acrylates to follow the urethane (meth)acrylate. Also useful are acrylates and methacrylates such as tris(2-hydroxyethyl)isocyanurate triacrylate.

The hydroxyl-containing material which is used in the present invention may be any liquid organic material having hydroxyl functionality of at least 1, and preferably at least 2. The material may be a liquid or a solid that is soluble or dispersible in the remaining components. The material should be substantially free of any groups which interfere with the curing reactions or which are thermally or photolytically unstable.

Preferably the organic material contains two or more primary or secondary aliphatic hydroxyl groups, by which is meant that the hydroxyl group is bonded directly to a non-aromatic carbon atom. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000.

Representative examples of suitable organic materials having a hydroxyl functionality of 1 include alkanols, monoalkyl ethers of polyoxyalkyleneglycols, monoalkyl ethers of alkyleneglycols, and others, and combinations thereof.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(−) -2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

Preferred hydroxyl-containing monomers are 1,4-cyclohexanedimethanol and aliphatic and cycloaliphatic monohydroxy alkanols.

Preferred hydroxyl-containing oligomers and polymers include hydroxyl and hydroxyl/epoxy functionalized polybutadiene, 1,4-cyclohexanedimethanol, polycaprolactone diols and triols, ethylene/butylene polyols, and monohydroxyl functional monomers. Preferred examples of polyether polyols are polypropylene glycols of various molecular weights and glycerol propoxylate-B-ethoxylate triol. Especially preferred are linear and branched polytetrahydrofuran polyether polyols available in various molecular weights, such as for example 250, 650, 1000, 2000, and 2900 MW.

In the compositions according to the invention, any type of photoinitiator that, upon exposure to actinic radiation, forms cations that initiate the reactions of the epoxy material (s) can be used. There are a large number of known and technically proven cationic photoinitiators for epoxy resins that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. Other cationic photoinitiators are metallocene salts, such as described, for example, in published European applications EP 94914 and 94915.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) Or "Chemistry & Technology of UV & EB Formulation for Coatings, Inks & Paints", Vol. 3 (edited by P. K. T. Oldring).

Preferred cationic photoinitiators are compounds of formula VI, VII or VIII below, $$[R_1—I—R_2]^+[Qm]^- \quad (VI)$$

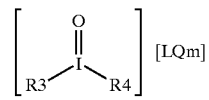 (VII)

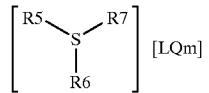 (VIII)

wherein:

$R_1$, $R_2$, $R_3$, $R_4$, $R_5$, $R_6$, and $R_7$ are each independently of the others C6–C18 aryl that is unsubstituted or substituted by suitable radicals, L is boron, phosphorus, arsenic, or antimony, Q is a halogen atom or some of the radicals Q in an anion LQm⁻ may also be hydroxy groups, and m is an integer that corresponds to the valence of L plus 1.

Examples of C6–C18 aryl are phenyl, naphthyl, anthryl, and phenanthryl. Any substituents present for suitable radicals are alkyl, preferably C1–C6 alkyl, such as methyl, ethyl, n-propyl, isopropyl, n-butyl, sec-butyl, iso-butyl, tert-butyl, or the various pentyl or hexyl isomers, alkoxy, preferably C1–C6 alkoxy such as methoxy, ethoxy, propoxy, butoxy, pentyloxy, or hexyloxy, alkylthio, preferably C1–C6 alkylthio, such as methylthio, ethylthio, propylthio, butylthio, pentylthio, or hexylthio, halogen, such as fluorine, chlorine, bromine, or iodine, amino groups, cyano groups, nitro groups, or arylthio, such as phenylthio.

Examples of preferred halogen atoms Q are chlorine and especially fluorine. Preferred anions $LQ_m^-$ are $BF_4^-$, $PF_6^-$, $AsF_6^-$, $SbF_6^-$, and $SbF_5(OH)^-$.

Especially preferred are compositions comprising as the cationic photoinitiator a compound of formula III wherein $R_5$, $R_6$ and $R_7$ are aryl, aryl being especially phenyl or biphenyl, or mixtures of those two compounds.

Also preferred are compositions comprising as component B) a compound of formula (IX)

$$[R_8(Fe''R_9)_c]_d^{+q}[x]_c^{-d},$$

wherein, c is 1 or 2, d is 1, 2, 3, 4 or 5,

X is a non-nucleophilic anion, especially $PF_6^-$, $AsF_6^-$, $SbF_6^-$, $CF_3SO_3^-$, $C_2F_5SO_3^-$, $n-C_3F_7SO_3^-$, $n-C_4F_9SO_3^-$, $n-C_6F_{13}SO_3^-$, or $n-C_8F_{17}SO_3^-$, R8 is a pi-arene, and R9 is an anion of a pi-arene, especially a cyclopentadienyl anion.

Examples of pi-arenes as R8 and anions of pi-arenes as R9 are to be found in published European patent application EP 94915.

Examples of preferred pi-arenes as R8 are toluene, xylene, ethylbenzene, cumene, methoxybenzene, methylnaphthalene, pyrene, perylene, stilbene, diphenylene oxide and diphenylene sulfide. Especially preferred are cumene, methylnaphthalene, or stilbene.

Examples of nonnucleophilic anions X⁻ are $FSO_3^-$, anions of organic sulfonic acids, of carboxylic acids, or anions $LQ_m^-$, as already defined above.

Preferred anions are derived from partially fluoro or erfluoroaliphatic or partially fluoro or perfluoro aromatic carboxylic acids, or especially from partially fluoro or perfluoroaliphatic or partially fluoro or perfluoroaromatic organic sulfonic acids, or they are preferably anions $LQ_m^-$.

Examples of anions X⁻ are $BF_4^-$, $PF_6^-$, $AsF_6^-$, $SbF_6^-$, $SbF_5(OH)^-$, $CF_3SO_3^-$, $C_2F_5SO_3^-$, $n\text{-}C_3F_7SO_3^-$, $n\text{-}C_4F_9SO_3^-$, $n\text{-}C_6F_{13}SO_3^-$, $n\text{-}C_8F_{17}SO_3^-$, $C_6F_5SO_3^-$, phosphorus tungstate, or silicon tungstate. Preferred are $PF_6^-$, $AsF_6^-$, $SbF_6^-$, $CF_3S_3O^-$, $C_2F_5SO_3^-$, $n\text{-}C_3F_7SO_3^-$, $n\text{-}C_4F_9SO_3^-$, $n\text{-}C_6F_{13}SO_3^-$, and $n\text{-}C_8F_{17}SO_3^-$.

The metallocene salts can also be used in combination with oxidizing agents. Such combinations are described in published European patent application EP 126712.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904. Other preferred sensitizers are benzoperylene, 1,8-diphenyl-1,3,5,7-octatetraene, and 1,6-diphenyl-1,3,5-hexatriene as described in U.S. Pat. No. 5,667,937. It will be recognized that an additional factor in the choice of sensitizer is the nature and primary wavelength of the source of actinic radiation.

In the compositions according to the invention, any type of photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide is used as photoinitiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula

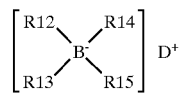

wherein $D^+$ is a cationic dye and $R_{12}$, $R_{13}$, $R_{14}$, and $R_{15}$ are each independently of the others alkyl, aryl, alkaryl, allyl, aralkyl, alkenyl, alkynyl, an alicyclic or saturated or unsaturated heterocyclic group. Preferred definitions for the radicals $R_{12}$ to $R_{15}$ can be found, for example, in published European patent application EP 223587.

Especially preferred is the free-radical photoinitiator 1-hydroxyphenyl ketone, which produces parts having the least amount of yellowing after final cure and provides articles which most closely simulate polypropylene.

Other additives which are known to be useful in solid imaging compositions may also be present in the composition of the invention. Stabilizers are often added to the compositions in order to prevent a viscosity build-up during usage in the solid imaging process. The preferred stabilizers are described in U.S. Pat. No. 5,665,792. Such stabilizers are usually hydrocarbon carboxylic acid salts of group IA and IIA metals. Most preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers are polyvinylpyrrolidones and polyacrylonitriles. Other possible additives include dyes, pigments, fillers, antioxidants, wetting agents, photosensitizers for the free-radical photoinitiator, leveling agents, surfactants and the like.

The liquid radiation-curable compositions can also contain any conventional cationically polymerizable organic compounds, either alone or in the form of a mixture with at least one further compound which can be polymerized cationically or by another mechanism, for example by means of free radicals. These include, for example, ethylenically unsaturated compounds which can be polymerized by a cationic mechanism, such as monoolefins and diolefins, for example isobutylene, butadiene, isoprene, styrene, α-methylstyrene, divinylbenzenes, N-vinylpyrrolidone, N-vinylcarbazole and acrolein, or vinyl ethers, for example methyl vinyl ether, isobutyl vinyl ether, trimethylolpropane trivinyl ether, ethylene glycol divinyl ether; cyclic vinyl ethers, for example 3,4-dihydro-2-formyl-2H-pyran (dimeric acrolein) and the 3,4-dihydro-2H-pyran-2-carboxylic ester of 2-hydroxymethyl-3,4-dihydro-2H-pyran, and vinyl esters, for example vinyl acetate and vinyl stearate. They can also be cationically polymerizable heterocyclic compounds, for example ethylene oxide, propylene oxide, epichlorohydrin, glycidyl ethers or monohydric alcohols or phenols, for example n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetanes, such as 3,3-dimethyloxetane and 3,3-di(chloromethyl)oxetane; tetrahydrofuran; dioxolanes, trioxane and 1,3,6-trioxacyclooctane; lactones, such as β-propiolactone, γ-valerolactone and ε-caprolactone; spiroether carbonates spiroether esters; thiiranes, such as ethylene sulfide and propylene sulfide; epoxy resins; linear and branched polymers containing glycidyl groups in the side chains, for example homopolymers and copolymers of polyacrylate and polymethacrylate glycidyl esters. Other suitable cationically polymerizable compounds are methylol compounds, which include amino resins, for example the N-hydroxymethyl-, N-methoxymethyl-, N-n-butoxymethyl- and N-acetoxymethyl derivatives of amides or amide-like compounds, for example cyclic ureas, such as ethyleneurea (imidazolidin-2-one), hydantoin, urone (tetrahydrooxadiazin-4-one), 1,2-propyleneurea (4-methylimidazolidin-2-one), 1,3-propyleneurea (hexahydro-2H-pyrimid-2-one), hydroxypropyleneurea (5-hydroxyhexahydro-2H-pyrimid-2-one), 1,3,5-melamine and further polytriazines, such as acetoguanamine, benzoguanamine and adipoguanamine. If desired, use can also be made of amino resins containing both N-hydroxymethyl and N-acetoxymethyl groups, for example hexamethylolmelamin, in which 1 to 3 of the hydroxyl groups have been etherified by means of methyl groups. Other suitable methylol compounds are phenolic resins, in particular resols prepared from a phenol and an aldehyde. The phenols which are suitable for this purpose include phenol itself, resorcinol, 2,2-bis(p-hydroxyphenyl)propane, p-chlorophenol, a phenol which is substituted by one or two alkyl groups each having 1 to 9 carbon atoms, such as o-, m- or p-cresol, the xylenols, p-tert-butylphenol and p-nonylphenol, and also phenyl-substituted phenols, in particular p-phenylphenol. The aldehyde condensed with the phenol is preferably formaldehyde, but other aldehydes, such as acetaldehyde and furfural, are also suitable. If desired, a mixture of such curable phenol-aldehyde resins can be used.

It is sometimes beneficial to describe the compositions in terms of equivalents or milliequivalents of epoxide containing material per 100 grams of total composition. The epoxy equivalent weight can be derived by dividing the molecular weight of a molecule by the number of epoxy groups contained within the molecule. The total epoxy equivalent weight of a composition is determined by first calculating the epoxy content of each component, i.e., epoxide-containing material, epoxy-acrylate, etc. The individual component epoxy equivalent weights are weight averaged for the entire composition.

The compositions of the invention preferably comprise from 10% to 20% by weight of free-radical polymerizable acrylic material, based on the total weight of the composition. It is most preferred that the acrylic be an aromatic and/or cycloaliphatic diacrylate or di-methacrylate.

The compositions of the invention preferably comprise from 10% to 20% by weight of hydroxy-containing material, based on the total weight of the composition.

It is sometimes beneficial to describe the compositions in terms of equivalents or milliequivalents of hydroxyl-containing material per 100 grams of total composition. The hydroxyl equivalent weight can be derived by dividing the molecular weight of a molecule by the number of hydroxyl groups contained within the molecule. The total number of equivalents of hydroxyl in a composition is determined by first calculating the hydroxyl content of each component, i.e., epoxide-containing material, epoxy-acrylate, polyol, initiator, etc. The individual component hydroxyl equivalent weights are weight averaged for the entire composition. All hydroxyls are assumed to be reactive, regardless of steric hinderance. It is preferred that the ratio of epoxy equivalents to hydroxy equivalents be in the range of from 1.5 to 3.8, more preferably 1.8 to 3.4.

In accounting for the percent by weight of the epoxy polymerizable, acrylic polymerizable, hydroxyl containing, cationic initiator, and radical intiator category components in the formulation, the following criteria were used. Components containing only epoxy functionality, hydroxyl functionality, or ethylenic unsaturation (acrylic functionality) were counted on a full weight basis in their respective polymerizable category. Those components containing both ethylenic unsaturation or radical initiator and hydroxyls, for example Acrylate 1 (see Examples) and 1-Hydroxycyclohexyl phenyl ketone, were divided 50:50 by weight into the respective categories. Those components containing epoxy, hydroxyl, and ethylenic unsaturation, for example Epoxy 5 (see Examples), were divided on a ⅓ basis by weight into the respective categories. The antioxidant was accounted on a full weight basis in the antioxidant category. The cationic initiator was accounted on a full weight basis in the cationic initiator category. No consideration was made to account for components which may have incomplete reactivity conversion (ex. conversion from a polyol to a polydiglycidyl by reaction with epichlorohydrin) during manufacture for the accounting of category components. However, when calculating ratios of epoxy equivalents to hydroxy equivalents, vendor measured and cited epoxy values were used in the calculation.

The compositions of the invention preferably comprise from about 0.2 to about 10% by weight of cationic photoinitiator, based on the total weight of the composition.

The compositions of the invention preferably comprise from about 0.01 to about 10% by weight of free-radical photoinitiator, based on the total weight of the composition.

The compositions of the invention can be prepared according to conventional procedures. In general, the components are combined by mixing in any suitable mixing apparatus. In some cases, some components can be premixed before adding to the total composition. In some cases, the mixing is carried out in the absence of light. In some cases, the mixing is carried out with some heating, generally at temperatures that range from about 30° C. to about 60° C.

The process for producing three-dimensional articles from the compositions of the invention, as discussed above, generally involves exposure of successive thin layers of the liquid composition to actinic radiation. A thin layer of the photosensitive composition of the invention is coated onto a surface. This is most conveniently done if the composition is a liquid. However, a solid composition can be melted to form a layer. The thin layer is then exposed imagewise to actinic radiation to form a first imaged cross-section. The radiation must provide sufficient exposure to cause substantial curing of the photosensitive composition in the exposed areas. By "substantial curing" it is meant that the photosensitive composition has reacted to an extent such that the exposed areas are physically differentiable from the unexposed areas. For liquid, gel or semi-solid photosensitive compositions, the cured areas will have hardened or solidified to a non-fluid form. For solid photosensitive compositions, the exposed areas will have a higher melting point than the non-exposed areas. Preferably, the exposure is such that portions of each successive layer are adhered to a portion of a previously exposed layer or support region, or to portions of a platform surface. An additional (second) thin layer of photosensitive composition is then coated onto the first imaged cross-section and imagewise exposed to actinic radiation to form an additional (second) imaged cross-section. These steps are repeated with the "nth" thin layer of photosensitive composition being coated onto the "(n−1)th" imaged cross-section and exposing to actinic radiation. The repetitions are carried out a sufficient number of times to build up the entire three-dimensional article.

The radiation is preferably in the range of 280–650 nm. Any convenient source of actinic radiation can be used, but lasers are particularly suitable. Useful lasers include HeCd, argon, nitrogen, metal vapor, and NdYAG lasers. The exposure energy is preferably in the range of 10–150 mJ/cm$^2$. Suitable methods and apparatus for carrying out the exposure and production of three-dimensional articles have been described in, for example, U.S. Pat. Nos. 4,987,044, 5,014,207, and 5,474,719, which teaches the use of pseudoplastic, plastic flow, thixotropic, gel, semi-solid and solid photopolymer materials in the solid imaging process.

In general, the three-dimensional article formed by exposure to actinic radiation, as discussed above, is not fully cured, by which is meant that not all of the reactive material in the composition has reacted. Therefore, there is often an additional step of more fully curing the article. This can be accomplished by further irradiating with actinic radiation, heating, or both. Exposure to actinic radiation can be accomplished with any convenient radiation source, generally a UV light, for a time ranging from about 10 to over 60 minutes. Heating is generally carried out at a temperature in the range of about 75–150° C., for a time ranging from about 10 to over 60 minutes.

EXAMPLES

The components 3,4-epoxycyclohexylmethyl-3,4-epoxycyclohexane carboxylate (Epoxy 1), 1,2-epoxytetradecane (Epoxy 2), diglycidyl ether of neopentyl glycol (Epoxy 4), trimethylolpropane triacrylate (Acrylate 2), polytetrahydrofuran linear chain (1000 mw) (Polyol 2), polytetrahydrofuran linear chain (650 mw) (Polyol 3), polytetrahydrofuran linear chain (250 mw) (Polyol 4), 1,4-cyclohexanedimethanol (CHDM) (Polyol 5), 1-hydroxycyclohexyl phenyl ketone (free-radical initiator; FRI) are available from Aldrich Chemical Company Inc. (Milwaukee, Wis.). α-(Oxiranylmethyl)-ω-(oxiranylmethoxy) poly(oxy-1,4-butanediyl) (MW 780) (Epoxy 3) is available from EMS Chemie of (Sumpter, S.C.). Partially acrylated bisphenol A epoxy (Epoxy 5) and the diacrylate ester of bisphenol A epoxy (Acrylate 1) are available from UCB Chemicals Corp. (Smyrna, Ga.). The 1,4-cyclohexanedimethanol diacrylate ester (Acrylate 3) is sold by Sartomer Company (Exton, Pa.). Aliphatic polycarbonate diol (MW 860) (Polyol 1) is available from Stahl USA (Peabody, Mass.). The mixed triarylsulfonium hexafluoroantimonate salts in 50% by weight propylene carbonate (cationic photoinitiator, CatI) is sold by Union Carbide Chemicals and Plastics Company Inc. (Danbury, Conn.). Thiodiethylene bis-(3,5-di-tert-butyl-4-hydroxy) hydrocinnamate (Antioxidant) is sold by Ciba (Hawthorne, N.Y.).

The individual components were weighed out, combined, then heated to 50° C. and mixed for several hours until all the ingredients were completely dissolved.

For all formulations, the exposure-working curve of the formula was determined using methods well known in the art. The working curve is a measure of the photospeed of the particular material. It represents the relationship between the thickness of a floating layer, scanned on the surface of the photopolymer in a vat or petridish, produced as a function of the exposure given. Parts were fabricated by forming a series of 6 mil (0.15 mm) coated layers, and giving enough imagewise exposure to each layer to create a cure that would correspond to a 10 mil (0.254 mm) working curve thickness.

All parts were fabricated using an Argon Ion laser operating with an output of 351 nm or 355 nm.

After the parts were formed, they were cleaned in a solvent, allowed to dry and then fully cured. All parts were given a UV postcure for 60 minutes in a Post Curing Apparatus, manufactured by 3D Systems, Inc. (Valencia, Calif.).

All tensile properties were measured according to ASTM Test D638M. The temperature and humidity of the Example parts were not controlled during testing. However, the temperature was approximately 20–22° C. and the humidity was approximately 20–30% RH. The properties of compositions detailed in this invention tend to change over time as further cross-linking occurs. All tests for physical properties were conducted approximately one week after the test parts were post-cured.

The impact strength of all the samples was measured by the notched Izod test, according to ASTM Test D256A.

The physical test values for polypropylene were obtained from various sources, including Modern Plastics Encyclopedia '98, Mid-November 1997 Issue, The McGraw-Hill Companies, Inc., New York, N.Y.

Examples 1–23

Compositions according to the invention were prepared having the components listed in Tables 1–5. Quantities are listed in weight percent.

TABLE 1

| INGREDIENT | Ex. 1 | Ex. 2 | Ex. 3 | Ex. 4 | Ex. 5 |
|---|---|---|---|---|---|
| Epoxy 1 | 33.8 | 47.6 | 43.7 | 43.1 | 46.4 |
| Epoxy 3 |  | 22.0 |  |  | 21.5 |
| Epoxy 4 | 15.0 |  |  |  |  |
| Acrylate 1 | 25.0 | 24.0 | 10.0 | 12.0 | 26.0 |
| Acrylate 2 |  |  | 11.0 | 13.0 |  |
| Polyol 1 | 18.0 |  | 25.0 | 24.0 |  |
| Polyol 5 |  |  | 2.0 |  |  |
| CatI | 4.6 | 2.5 | 4.3 | 4.1 | 2.7 |
| FRI | 3.4 | 3.7 | 3.8 | 3.6 | 3.2 |
| Antioxidant | 0.2 | 0.2 | 0.2 | 0.2 | 0.2 |
| % Epoxy | 48.8 | 69.6 | 43.7 | 43.1 | 67.9 |
| % Acrylate | 12.5 | 12.0 | 16.0 | 19.0 | 13.0 |
| % CatI | 32.2 | 13.9 | 33.9 | 31.8 | 14.6 |
| % FRI | 4.6 | 2.5 | 4.3 | 4.1 | 2.7 |
| % Antioxidant | 1.7 | 1.9 | 1.9 | 1.8 | 1.6 |
| Epoxy/Hydroxy Equiv. Wt. | 2.41 | 3.57 | 2.36 | 2.8 | 3.33 |

TABLE 2

| INGREDIENT | Ex. 6 | Ex. 7 | Ex. 8 | Ex. 9 | Ex. 10 |
|---|---|---|---|---|---|
| Epoxy 1 | 43.8 | 45.5 | 38.5 | 46.4 | 44.4 |
| Epoxy 3 |  |  |  | 21.5 |  |
| Epoxy 4 |  |  | 15.0 |  |  |
| Acrylate 1 | 10.0 | 24.0 | 8.0 | 26.0 | 11.0 |

TABLE 2-continued

| INGREDIENT | Ex. 6 | Ex. 7 | Ex. 8 | Ex. 9 | Ex. 10 |
|---|---|---|---|---|---|
| Acrylate 2 | 11.0 | | 9.0 | | 12.0 |
| Acrylate 3 | | 3.5 | | | |
| Polyol 1 | 25.0 | | 15.0 | | 24.5 |
| Polyol 2 | | 21.0 | | | |
| Polyol 5 | 2.0 | | 6.0 | | |
| CatI | 4.8 | 2.6 | 4.1 | 2.7 | 4.5 |
| FRI | 3.2 | 3.3 | 4.2 | 3.2 | 3.4 |
| Antioxidant | 0.2 | 0.1 | 0.2 | 0.2 | 0.2 |
| % Epoxy | 43.8 | 45.5 | 53.5 | 67.9 | 44.4 |
| % Acrylate | 16.0 | 15.5 | 13.0 | 13.0 | 17.5 |
| % CatI | 33.6 | 34.7 | 27.1 | 14.6 | 31.7 |
| % FRI | 4.8 | 2.6 | 4.1 | 2.7 | 4.5 |
| % Antioxidant | 1.6 | 1.7 | 2.1 | 1.6 | 1.7 |
| Epoxy/Hydroxy Equiv. Wt. | 2.42 | 2.25 | 2.39 | 3.33 | 2.98 |

TABLE 3

| INGREDIENT | Ex. 11 | Ex. 12 | Ex. 13 | Ex. 14 | Ex. 15 |
|---|---|---|---|---|---|
| Epoxy 1 | 46.4 | 39.3 | 46.8 | 41.7 | 45.4 |
| Epoxy 3 | 21.5 | | | | 22.5 |
| Epoxy 5 | | | | 6.0 | |
| Acrylate 1 | 26.0 | 24.0 | 12.0 | 7.0 | 26.0 |
| Acrylate 2 | | | 13.0 | 11.0 | |
| Acrylate 3 | | 3.5 | | | |
| Polyol 1 | | 25.0 | | 24.0 | |
| Polyol 3 | | | 15.0 | | |
| Polyol 4 | | | 4.0 | | |
| Polyol 5 | | | | 2.0 | |
| CatI | 2.7 | 4.8 | 5.4 | 4.3 | 2.7 |
| FRI | 3.2 | 3.2 | 3.6 | 3.8 | 3.2 |
| Antioxidant | 0.2 | 0.2 | 0.2 | 0.2 | 0.2 |
| % Epoxy | 67.9 | 39.3 | 46.8 | 43.7 | 67.9 |
| % Acrylate | 13.0 | 15.5 | 19.0 | 16.5 | 13.0 |
| % CatI | 14.6 | 38.6 | 26.8 | 33.4 | 14.6 |
| % FRI | 2.7 | 4.8 | 5.4 | 4.3 | 2.7 |
| % Antioxidant | 1.6 | 1.6 | 1.8 | 1.9 | 1.6 |
| Epoxy/Hydroxy Equiv. Wt. | 3.33 | 1.82 | 2.45 | 2.35 | 3.28 |

TABLE 4

| INGREDIENT | Ex. 16 | Ex. 17 | Ex. 18 | Ex. 19 | Ex. 20 |
|---|---|---|---|---|---|
| Epoxy 1 | 37.5 | 45.4 | 44.3 | 41.9 | 47.7 |
| Epoxy 3 | | 22.5 | | 21.0 | |
| Epoxy 5 | 25.0 | | | | |
| Acrylate 1 | | 26.0 | 24.0 | 24.0 | 12.0 |
| Acrylate 2 | 9.0 | | | | 13.0 |
| Acrylate 3 | | | 3.50 | 3.6 | |
| Polyol 1 | 19.0 | | 20.0 | | |
| Polyol 3 | | | | | 16.0 |
| Polyol 4 | | | | | 2.0 |
| Polyol 5 | 1.0 | | | 3.5 | |
| CatI | 4.1 | 2.7 | 4.6 | 2.6 | 5.5 |
| FRI | 4.2 | 3.2 | 3.4 | 3.3 | 3.6 |
| Antioxidant | 0.2 | 0.2 | 0.2 | 0.2 | 0.2 |
| % Epoxy | 45.8 | 67.9 | 44.3 | 62.9 | 47.7 |
| % Acrylate | 17.3 | 13.0 | 15.5 | 15.6 | 19.0 |
| % CatI | 30.4 | 14.6 | 33.7 | 17.1 | 25.8 |
| % FRI | 4.1 | 2.7 | 4.6 | 2.6 | 5.5 |
| % Antioxidant | 2.1 | 1.6 | 1.7 | 1.6 | 1.8 |
| Epoxy/Hydroxy Equiv. Wt. | 3.13 | 3.28 | 2.18 | 2.31 | 2.75 |

TABLE 5

| INGREDIENT | Ex. 21 | Ex. 22 | Ex. 23 |
|---|---|---|---|
| Epoxy 1 | 35.7 | 45.8 | 43.3 |
| Epoxy 2 | | 5.0 | |
| Epoxy 3 | | | 22.5 |
| Epoxy 5 | 27.0 | | |
| Acrylate 1 | | 25.0 | 26 |
| Acrylate 2 | 10.0 | | |
| Polyol 1 | 18.0 | 16.0 | |
| Polyol 5 | 1.0 | | |
| CatI | 4.3 | 4.6 | 4.8 |
| FRI | 3.8 | 3.4 | 3.2 |
| Antioxidant | 0.2 | 0.2 | 0.2 |
| % Epoxy | 44.7 | 50.8 | 65.8 |
| % Acrylate | 19.0 | 12.5 | 13.0 |
| % CatI | 29.9 | 30.2 | 14.6 |
| % FRI | 4.3 | 4.6 | 4.8 |
| % Antioxidant | 1.9 | 1.7 | 1.6 |
| Epoxy/Hydroxy Equiv. Wt. | 2.49 | 2.48 | 3.15 |

The compositions of the invention were exposed and tested as described above. Examples 2, 5, 7, 9, 11, 15, 17 and 19 were exposed at 351 nm. Examples 1, 3, 4, 6, 8, 10, 12, 13, 14, 16, 18 and 20–23 were exposed at 355 nm. The properties are given in Table 6 below.

TABLE 6

| | Tensile Modulus ($N/mm^2$) | Elongation at Yield (%) | Average Elongation at Break (%) | Yield Strength ($kN/mm^2$) |
|---|---|---|---|---|
| Polypropylene | 1135 to 1550 | 7.0 to 13.0 | 100 to 200 | 31 to 37.3 |
| Example 1 | 1119 | 7.7 to No Yield | 21 | 26 |
| Example 2 | 1135 | No Yield | 12.4 | 26.2 |
| Example 3 | 1194 | 5.1 to 5.9 | 23.2 | 27.2 |
| Example 4 | 1202 | 5.0 to 7.2 | 16.1 | 28.9 |
| Example 5 | 1299 | 4.6 to No Yield | 11.5 | 30.7 |
| Example 6 | 1322 | 4.0 to 5.3 | 30.3 | 32.9 |
| Example 7 | 1331 | No Yield | 20.3 | 32.9 |
| Example 8 | 1378 | 4.1 to 4.4 | 29.4 | |
| Example 9 | 1403 | 7 to No Yield | 10.8 | 32.8 |
| Example 10 | 1404 | 4.8 to 5.0 | 21.2 | 33.64 |
| Example 11 | 1418 | 4.2 to No Yield | 13.8 | 32.9 |
| Example 12 | 1432 | 5.7 to 6.1 | 29.4 | 31.8 |
| Example 13 | 1443 | 4.8 to 5.0 | 22.6 | 32.2 |
| Example 14 | 1487 | 4.6 to 4.7 | 31 | 32.7 |
| Example 15 | 1555 | 3.9 to 5.2 | 12.2 | 35.9 |
| Example 16 | 1558 | 4.3 to 4.5 | 19.3 | 32 |
| Example 17 | 1565 | 3.9 to 5.2 | 12.2 | 35.9 |
| Example 18 | 1666 | 4.8 to 5.1 | 15.3 | 34.2 |
| Example 19 | 1667 | 4.7 to 5.0 | 15.5 | 35.8 |
| Example 20 | 1787 | 4.4 to 4.5 | 23.9 | 40.2 |
| Example 21 | 1840 | 4.2 to 4.5 | 11.9 | 35.9 |
| Example 22 | 1947 | 5 to 5.5 | 11.3 | 34.2 |
| Example 23 | 1405 | 6.7 to No Yield | 33.6 | 16.5 |

The formulations in Examples 1–23 produced parts having a hazy appearance that looked just like polypropylene. The tensile modulus and elongation at yield was favorable for simulating the feel of polypropylene. The notched Izod impact strength (ASTM D256) of Example 9 was 33.36 J/m. The flexural modulus and flexural strength of Example 9, determined by 3-point flex test (ASTM 790), was 1300 MPa and 63 MPa, respectively. These values compare favorably with the flexural modulus of polypropylene.

What is claimed is:
1. A photosensitive composition comprising:
   (a) an epoxide containing material;
   (b) an aliphatic polyfunctional (meth)acrylate;
   (c) a hydroxyl-containing material selected from the group consisting of aliphatic polycarbonate diols and polytetrahydrofuran polyether polyols;

(d) at least one cationic photoinitiator;
(e) at least one free-radical photoinitiator; and
(f) an aromatic or cycloaliphatic acrylic material;
wherein said composition, after full cure by exposure to actinic radiation and optionally heat, has:
(i) a tensile modulus in the range of 1000 to 1600 N/mm$^2$; and
(ii) an average elongation at break of at least 10%.

2. The composition of claim 1, wherein said hydroxyl-containing material includes an aliphatic polycarbonate diol.

3. The composition of claim 1, wherein said hydroxyl-containing material includes a polytetrahydrofuran polyether polyol.

4. The composition of claim 3, wherein said polytetrahydrofuran polyether polyol has a molecular weight in the range of 250–2900.

5. The composition of claim 3, wherein said polytetrahydrofuran polyether polyol has a molecular weight of about 1000.

6. The composition of claim 1, wherein said composition comprises trimethylolpropane triacrylate.

7. The composition of claim 3, wherein said composition comprises an acrylate of bisphenol A diepoxide.

8. The composition of claim 3, wherein said composition comprises dipentaerythritol monohydroxpenta(meth)acrylate.

9. The composition of claim 3, wherein said composition comprises 10–20% by weight of acrylic material.

10. A process for forming a three-dimensional article comprising:
(1) coating a layer of the composition of claim 1 onto a surface;
(2) exposing the layer imagewise to actinic radiation to form an imaged cross-section, wherein the radiation is of sufficient intensity to cause substantial curing of the layer in the exposed areas;
(3) coating a layer of the composition of claim 1 onto the previously exposed imaged cross-section;
(4) exposing said layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;
(5) repeating steps (3) and (4) a sufficient number of times in order to build up a three-dimensional article.

11. A three dimensional article Conned by the process of claim 10.

12. The composition of claim 1, wherein said composition comprises a mixture of epoxy-containing materials.

13. The composition of claim 1, wherein said composition comprises 5–35 wt % of said aromatic or cycloaliphatic acrylic material.

* * * * *